United States Patent
Kawada et al.

[11] Patent Number: 5,665,260
[45] Date of Patent: Sep. 9, 1997

[54] CERAMIC ELECTROSTATIC CHUCK WITH BUILT-IN HEATER

[75] Inventors: Nobuo Kawada; Shoji Kano; Koji Hagiwara; Nobuo Arai, all of Gunma-ken; Junichi Arami, Tokyo; Kenji Ishikawa, Kanagawa-ken, all of Japan

[73] Assignees: Shin-Etsu Chemical Co., Ltd.; Tokyo Electoron Limited, both of Tokyo, Japan

[21] Appl. No.: 364,196

[22] Filed: Dec. 27, 1994

[30] Foreign Application Priority Data

Dec. 27, 1993 [JP] Japan .................. 5-330764
Dec. 20, 1994 [JP] Japan .................. 6-316374

[51] Int. Cl.⁶ .................. H05B 3/68; H05B 3/44
[52] U.S. Cl. .................. 219/464; 219/544; 361/233
[58] Field of Search .................. 219/464, 468, 219/457, 552, 553, 543, 544; 361/234, 233; 279/128; 269/8

[56] References Cited

U.S. PATENT DOCUMENTS

| | | | |
|---|---|---|---|
| 4,900,396 | 2/1990 | Hayashi | 156/651 |
| 5,155,652 | 10/1992 | Logan | 219/464 |
| 5,166,856 | 11/1992 | Liporace et al. | 361/234 |
| 5,328,761 | 7/1994 | Omori | 428/336 |
| 5,343,022 | 8/1994 | Gilbert | 219/552 |
| 5,384,682 | 1/1995 | Watanabe | 361/234 |

*Primary Examiner*—Teresa J. Walberg
*Assistant Examiner*—Sam Paik
*Attorney, Agent, or Firm*—McAulay Fisher Nissen Goldberg & Kiel, LLP

[57] ABSTRACT

A ceramic electrostatic chuck with a built-in heater having electrodes of an electroconductive ceramic bonded to a surface of a supporting substrate of an electrically conducting ceramic. A heat generating layer of an electroconductive ceramic is bonded to the other surface of the supporting substrate and a covering layer of an electrically insulating ceramic is provided thereon. Each of the supporting substrate, electrode for the electrostatic chuck and heat generating layer has a surface roughness Rmax of 5 μm or larger.

6 Claims, 1 Drawing Sheet

CERAMIC ELECTROSTATIC CHUCK WITH BUILT-IN HEATER

BACKGROUND OF THE INVENTION

The present invention relates to a ceramic electrostatic chuck with built-in heater or, more particularly, to a ceramic electrostatic chuck with built-in heater used in the temperature elevation and lowering step in a semiconductor process.

Where a heater of wound metal wire has been used for heating of a semiconductor wafer in the manufacturing process of semiconductor devices, contamination of the semiconductor wafer with metals may occur. As a solution to this problem, the use of an integral ceramic heater using a thin film of a ceramic as the heat generating body has been proposed (see official publication of Japanese Patent Kokai No. 4-124076). An electrostatic chuck has been used to fix the semiconductor wafer to the heater during heating at reduced atmospheric pressures. The material from which electrostatic chucks are made is increasingly changing from resins to ceramics as the semiconductor processing temperatures rise higher and higher (see official publication of Japanese Patent Kokai No. 52-67353 and official publication of Japanese Patent Kokai No. 59-124140). Recently, a ceramic electrostatic chuck with built-in heater, which is an integral combination of such a ceramic heater and ceramic electrostatic chuck, has also proposed (see official publication of Japanese Patent Kokai No. 4-358074, official publication of Japanese Patent Kokai No. 5-109876 and official publication of Japanese Patent Kokai No. 5-129210).

However, such a ceramic electrostatic chuck with built-in heater basically has a structure in which different kinds of ceramics are bonded together or, for example, a structure in which an electroconductor layer of graphite and an insulating layer of boron nitride are bonded to a substrate of boron nitride. Such structures have the problem that, during repeated temperature elevation and lowering, separation takes place in the bonded parts because of the thermal stress due to the difference in the thermal expansion coefficients of the materials.

SUMMARY OF THE INVENTION

The present invention relates to a ceramic electrostatic chuck with built-in heater which solves these disadvantages and defects. A ceramic electrostatic chuck with built-in heater according to the current invention has electrodes for electrostatic chucking made from an electroconductive ceramic bonded to one surface of a supporting substrate made from an electrically insulating ceramic, a heat generating layer made from an electroconductive ceramic bonded to the other surface and a covering layer of electrically insulating ceramic, where each of the supporting substrate, electrodes and heat generating layer has a surface roughness Rmax of 5 µm or larger. Ceramic electrostatic chucks of the present invention are further characterized in that a diffusion-preventing layer is bonded on to the covering layer.

The inventors have conducted extensive investigations on methods for the prevention of separation of the bonded parts in a heretofore known ceramic electrostatic chuck with a built-in heater. As a result, they have arrived at the discovery that, in a known ceramic electrostatic chuck with built-in heater having electroconductive ceramic electrodes for electrostatic chucking bonded to one surface of a supporting substrate made from an electrically insulating ceramic, a heat generating layer made from an electroconductive ceramic bonded to the other surface and a covering of electrically insulating ceramic, separation at the bonded parts never takes place when each of the supporting substrate, electrodes for electrostatic chuck and heat generating layer has a surface roughness of 5 µm or larger. This discovery leads to completion of the present invention after continued studies on the kinds of electrically insulating ceramic members and electroconductive ceramics for use in the ceramic electrostatic chuck with built-in heater, preparation method for the desired surface roughness and so on.

BRIEF DESCRIPTION OF THE DRAWING

Shown is a vertical cross sectional view of an example of the ceramic electrostatic chuck with built-in heater of the present invention.

DESCRIPTION OF THE PREFERRED EMBODIMENT

Figure 1:
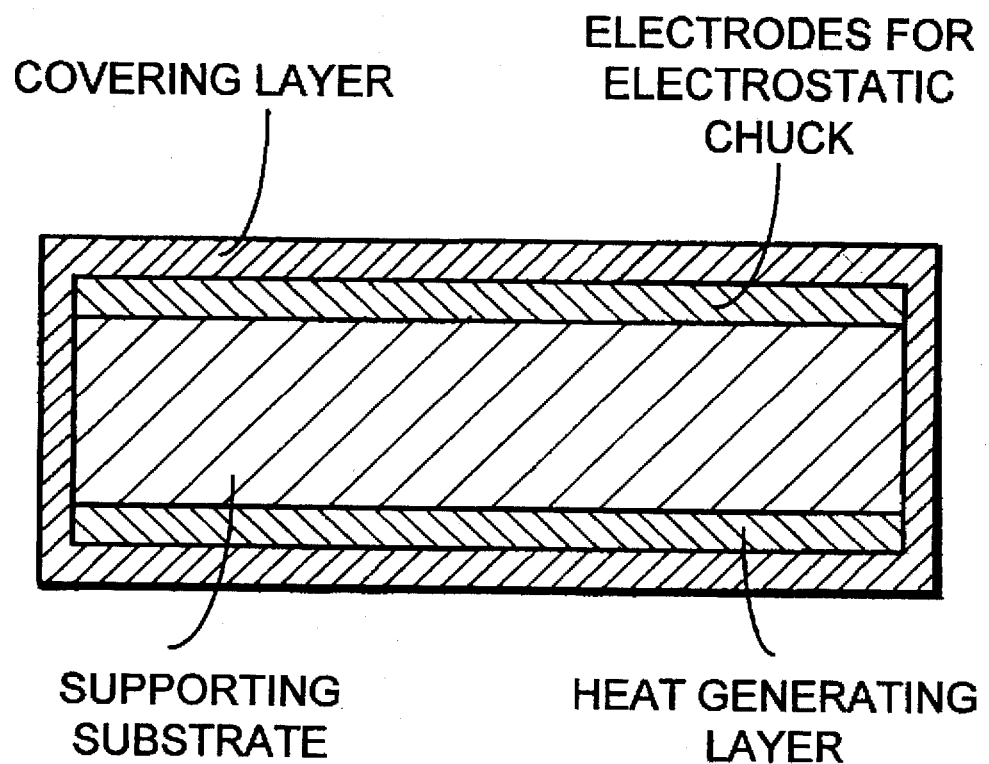

A ceramic electrostatic chuck with built-in heater according to the current invention has electrodes for electrostatic chucking made from an electroconductive ceramic bonded to one surface of a supporting substrate made from an electrically insulating ceramic, a heat generating layer made from an electroconductive ceramic bonded to the other surface and a covering of electrically insulating ceramic, where each of the supporting substrate, electrodes and heat generating layer has a surface roughness Rmax of 5 µm or larger. An advantage is obtained therewith in that the ceramic electrostatic chuck with built-in heater is imparted with long durability because the bonded layers will not separate during repeated heating and cooling.

The ceramic electrostatic chuck with built-in heater of the present invention is formed by bonding electrodes for electrostatic chucking made from an electroconductive ceramic on to a surface of a supporting substrate made from an electrically insulating ceramic along with bonding of a heat generating layer made from an electroconductive ceramic on to the other surface and providing a covering layer made from an electrically insulating ceramic thereon so that this constitution per se is known. However, such a known ceramic electrostatic chuck with built-in heater has the very serious defect that, although the supporting substrate, electrodes for electrostatic chuck, heat generating layer and covering layer are integrally bonded together, they have differences in the thermal expansion coefficients. When heating and cooling are repeated between room temperature and about 1100° C., these thermal expansion differences cause separation between the various bonded layers, ultimately destroying the chuck.

In contrast thereto, when the surfaces of the supporting substrate, electrodes for electrostatic chucking and heat generating layer are surfaces having a roughness Rmax of at least 5 µm according to the present invention, the physical bonding strength between the supporting substrate and the electrodes for electrostatic chucking and heat generating layer bonded thereto and the physical bonding strength between the electrodes for electrostatic chucking or heat generating layer and the covering layer bonded thereto are increased by the anchoring effect, thereby preventing separation of the bonded parts even after repeated heating and cooling between room temperature and 1100° C. An advantage is obtained over a conventional ceramic electrostatic chuck with built-in heater because a ceramic electrostatic chuck with built-in heater according to the present invention is imparted with increased durability.

As is shown in FIG. 1, the ceramic electrostatic chuck with built-in heater of the present invention comprises a supporting substrate, electrodes for electrostatic chucking, heat generating layer and covering layer. This supporting substrate is made from an electrically insulating ceramic. Since the ceramic electrostatic chuck with built-in heater of the present invention has as an object use in semiconductor production and this process involves not only Si semiconductors but also III–V Group compound semiconductors, the supporting substrate is preferably made from boron nitride, a mixture of boron nitride and aluminum nitride or silicon nitride constituted from elements belonging to the same groups. Boron nitride can be obtained by sintering according to a known method or by the chemical vapor-phase deposition method obtained by reacting, for example, ammonia and boron trichloride at 1900° to 2000° C. and 10 Torr. The mixture of boron nitride and aluminum nitride can be obtained by sintering according to a known method. Silicon nitride can be obtained by sintering according to a known method or by the chemical vapor-phase deposition method obtained by reacting, for example, ammonia and silicon tetrachloride at 1400° to 1500° C. and 5 Torr.

The electrodes for electrostatic chucking and the heat generating layer are made from an electroconductive ceramic, preferably pyrolytic graphite. Pyrolytic graphite is particularly suited because of its very similar thermal expansion coefficient and relatively good adhesion to boron nitride and the like. Pyrolytic graphite can be obtained, for example, by subjecting methane gas to pyrolysis at 1900° to 2200° C. and 5 Torr. The electrodes and heat generating layer may also be constructed from silicon carbide by the chemical vapor-phase deposition method, for example, by reacting an organosilicon compound such as methyl trichlorosilane and the like under the conditions of 1250° C. and 3 Torr. The covering layer is made from an electrically insulating ceramic, preferably the same one as the supporting substrate and made by the chemical vapor-phase deposition method for purity.

In the present invention, it is essential that the surfaces of the supporting substrate, electrodes for electrostatic chucking and heat generating layer have a surface roughness of at least 5 μm, which can be achieved, for example, by subjecting those surfaces to a sand-blasting treatment, whereby the boron nitride, mixture of boron nitride and aluminum nitride or silicon nitride for the supporting substrate and the graphite or silicon carbide for the electrodes for electrostatic chuck and heat generating layer can be readily imparted with a surface roughness Rmax of 5 to 50 μm. After the surface of the supporting substrate is imparted with a surface roughness of at least 5 μm in this manner, the electrodes for electrostatic chucking and heat generating layer are bonded thereto. After imparting the electrodes for electrostatic chuck and heat generating layer with a surface roughness of at least 5 μm, the covering layer is bonded thereto to give the ceramic electrostatic chuck with built-in heater according to the present invention which has a long life without the troubles of separation of the component layers due to the changes in temperature. By virtue of the increased physical bonding strength between layers as a consequence of the anchoring effect due to this surface roughness, separation of the layers does not occur even when subjected, for example, to a test of repeated heating and cooling between room temperature and 1100° C.

The ceramic electrostatic chuck of the present invention having a covering layer made from boron nitride or a mixture of boron nitride and aluminum nitride, which features elements of the same Groups as the III–V Group metal containing semiconductor, prevents contamination of the semiconductor with an element of the Group IV. When the covering layer is made from silicon nitride, contamination of Si semiconductors by an element of Group III is prevented.

Another problem in certain processes is the damage of the semiconductor device by leaking current from the electrostatic chuck so that the covering layer sometimes requires the high insulating resistance of boron nitride. However, when the covering layer is made from boron nitride, contamination of silicon semiconductors may take place in some cases by the diffusion of boron from the covering layer, especially in a high temperature process. This contamination can be prevented by providing a diffusion-preventing layer of silicon oxide, silicon nitride or the like on the covering layer.

Additional prevention of contamination is obtained when the boron nitride, silicon nitride, graphite and silicon carbide used in the ceramic electrostatic chuck are formed by the chemical vapor-phase deposition method, because they are of a high purity without containing impurities such as binders and the like as compared with those prepared by the sintering method.

In the following, Examples and Comparative Examples of the present invention are given.

EXAMPLE 1 AND COMPARATIVE EXAMPLE 1

A disc made from pyrolytic boron nitride having a diameter of 160 mm and a thickness of 1 mm was prepared by reacting ammonia and boron trichloride under the conditions of 2000° C. and 10 Torr followed by a sand blasting treatment to impart both surfaces with a surface roughness Rmax of 5 μm.

Next, a pyrolytic graphite layer having a thickness of 40 μm was formed thereon by the pyrolysis of methane gas under the conditions of 2200° C. and 5 Torr which was mechanically worked into the electrode pattern on one surface and the heater pattern on the other surface to serve as the electrodes for electrostatic chuck and heat generating layer, respectively, followed by a sand blasting treatment to impart the surfaces thereof with a surface roughness Rmax of 5 μm.

Finally, ammonia and boron trichloride were reacted as above to provide a covering layer of pyrolytic boron nitride having a thickness of 100 μm thereon so as to prepare a ceramic electrostatic chuck with built-in heater. This electrostatic chuck was subjected to 100 cycle of temperature elevation and temperature lowering from room temperature to 1100° C. without causing separation of the supporting substrate, electrodes for electrostatic chuck, heat generating layer and covering layer thereof at the bonded parts.

For comparison, a ceramic electrostatic chuck with built-in heater was prepared in the same manner, except that the surfaces of the supporting substrate, electrodes for electrostatic chuck and heat generating layer had a surface roughness Rmax of 3 μm, and was subjected to the same separation test to find that separation took place at the bonded parts at a moment after 9 cycles of temperature elevation and temperature lowering between room temperature and 1100° C.

EXAMPLE 2 AND COMPARATIVE EXAMPLE 2

A disc of silicon nitride having a diameter of 160 mm and a thickness of 1 mm was prepared by the chemical vapor-phase deposition method by reacting ammonia and silicon tetrachloride under the conditions of 1400° C. and 5 Torr, followed by a sand blasting treatment so as to impart both surfaces thereof with a surface roughness Rmax of 6 μm.

Next, a silicon carbide layer having a thickness of 100 μm was formed by the chemical vapor-phase deposition method thereon by the pyrolysis of methyl trichloro silane under the conditions of 1250° C. and 3 Torr, and an electrode pattern on one surface and a heater pattern on the other surface were mechanically worked to serve as the electrodes for electrostatic chucking and heat generating layer, respectively. A sand blasting treatment imparted the surfaces thereof with a surface roughness Rmax of 7 μm.

Finally, ammonia and silicon tetrachloride were reacted as above provide a covering layer of silicon nitride by the chemical vapor-phase deposition method having a thickness of 150 μm thereon so as to prepare a ceramic electrostatic chuck with built-in heater. This electrostatic chuck was subjected to 100 cycles of temperature elevation and temperature lowering from room temperature to 1100° C. without causing separation of the supporting substrate, electrodes for electrostatic chuck, heat generating layer and covering layer thereof at the bonded parts.

For comparison, a ceramic electrostatic chuck with built-in heater was prepared in the same manner, except that the surfaces of the supporting substrate, electrodes for electrostatic chuck and heat generating layer had a surface roughness Rmax of 2 μm and the same was subjected to the same separation test to find that separation took place at the bonded parts at a moment after 5 cycles of temperature elevation and temperature lowering between room temperature and 1100° C.

EXAMPLE 3 AND COMPARATIVE EXAMPLE 3

A disc of silicon nitride having a diameter of 160 mm and a thickness of 1 mm was prepared by the chemical vapor-phase deposition method by reacting ammonia and silicon tetrachloride under the conditions of 1400° C. and 5 Torr followed by a sand blasting treatment so as to impart both surfaces thereof with a surface roughness Rmax of 9 μm.

Finally, ammonia and silicon tetrachloride were reacted as above to provide a covering layer of silicon nitride by the chemical vapor-phase deposition method having a thickness of 100 μm thereon so as to prepare a ceramic electrostatic chuck with built-in heater. This electrostatic chuck was subjected to 100 cycles of temperature elevation and temperature lowering from room temperature to 1100° C. without causing separation of the supporting substrate, electrodes for electrostatic chuck, heat generating layer and covering layer thereof at the bonded parts.

For comparison, a ceramic electrostatic chuck with built-in heater was prepared in the same manner, except that the surfaces of the supporting substrate, electrodes for electrostatic chuck and heat generating layer had a surface roughness Rmax of 4 μm, and was subjected to the same separation test to find that separation took place at the bonded parts at a moment after 26 cycles of temperature elevation and temperature lowering between room temperature and 1100° C.

EXAMPLE 4 AND COMPARATIVE EXAMPLE 4

A powder of boron nitride and a powder of aluminum nitride were blended in a proportion of 3:1 followed by sintering under the conditions of 1900° C. and 200 kgf/cm² to prepare a disc having a diameter of 200 mm and a thickness of 1 mm consisting of a sintered blend body of boron nitride and aluminum nitride followed by a sand blasting treatment to impart both surfaces thereof with a surface roughness Rmax of 20 μm.

Next, a pyrolytic graphite layer having a thickness of 100 μm was formed thereon by the pyrolysis of methane gas under the conditions of 2200° C. and 5 Torr, and an electrode pattern on one surface and a heater pattern on the other surface were mechanically worked to serve as the electrodes for electrostatic chuck and heat generating layer, respectively. A sand blasting treatment imparted both these surfaces with a surface roughness Rmax of 7 μm.

Finally, ammonia and boron trichloride were reacted under the conditions of 1800° C. and 5 Torr to provide a covering layer of pyrolytic boron nitride by the chemical vapor-phase deposition method having a thickness of 200 μm thereon so as to prepare a ceramic electrostatic chuck with built-in heater. This electrostatic chuck was subjected to 100 cycles of temperature elevation and temperature lowering from room temperature to 1100° C. without causing separation of the supporting substrate, electrodes for electrostatic chuck, heat generating layer and covering layer thereof at the bonded parts.

For comparison, a ceramic electrostatic chuck with built-in heater was prepared by the same treatment, except that the surfaces of the supporting substrate, electrodes for electrostatic chuck and heat generating layer had a surface roughness Rmax of 4 μm, and the same was subjected to separation test to find that separation took place at the bonded parts at a moment after 3 cycles of temperature elevation and temperature lowering between room temperature and 1100° C.

The present invention relates to a ceramic electrostatic chuck with built-in heater, having electrodes for electrostatic chucking made from an electroconductive ceramic bonded to a surface of a supporting substrate made from an electrically insulating ceramic, a heat-generating layer made from an electroconductive ceramic bonded to the other surface and a covering layer made from an electrically insulating ceramic provided thereon, the invention being characterized by each of the supporting substrate, electrodes for electrostatic chucking and heat generating layer having a surface roughness Rmax of 5 μm or larger. Since the surfaces of the supporting substrate, electrodes for electrostatic chuck and heat generating layer are imparted with a surface roughness Rmax of 5 μm or larger, the physical bonding strength between them is increased by the anchoring effect, and this ceramic electrostatic chuck with built-in heater is imparted with the advantage that separation never takes place at the bonded parts so that the durability is very long.

We claim:

1. A ceramic electrostatic chuck having a built-in heater comprising a supporting substrate having opposite first and second surfaces, a heat generating layer of an electroconductive ceramic bonded to the first surface, an electrode layer bonded to the second surface so as to sandwich the substrate between the heat generating layer and the electrode layer, and a covering layer of an electrically insulating ceramic covering said electrode layer and said heat generating layer, wherein said electrode layer and said heat generating layer have a surface roughness Rmax of 5 μm or larger.

2. The ceramic electrostatic chuck with built-in heater described in claim 1 wherein said supporting substrate and said covering layer are made from boron nitride, a mixture of boron nitride and aluminum nitride or silicon nitride and the said electrodes for electrostatic chuck and said heat generating layer are made from graphite or silicon carbide.

3. The ceramic electrostatic chuck with built-in heater described in claim 1 wherein a diffusion-preventing layer is bonded on to the said covering layer.

4. The ceramic electrostatic chuck with built-in heater described in claim 3 wherein the diffusion-preventing layer is made from silicon oxide or silicon nitride.

5. The ceramic electrostatic chuck with built-in heater described in claim 2 wherein a diffusion-preventing layer is bonded on to the said covering layer.

6. The ceramic electrostatic chuck with built-in heater described in claim 2 wherein the diffusion-preventing layer is made from silicon oxide or silicon nitride.

* * * * *